(12) United States Patent
Kim et al.

(10) Patent No.: US 9,793,415 B2
(45) Date of Patent: Oct. 17, 2017

(54) SEMICONDUCTOR DEVICE AND METHOD OF MANUFACTURING THE SAME

(71) Applicant: Samsung Display Co., Ltd., Yongin, Gyeonggi-Do (KR)

(72) Inventors: Junghyun Kim, Yongin (KR); Kiwan Ahn, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 40 days.

(21) Appl. No.: 15/065,281

(22) Filed: Mar. 9, 2016

(65) Prior Publication Data

US 2017/0098718 A1 Apr. 6, 2017

(30) Foreign Application Priority Data

Oct. 1, 2015 (KR) ........................ 10-2015-0138610

(51) Int. Cl.
  *H01L 33/00* (2010.01)
  *H01L 21/00* (2006.01)
  *H01L 29/786* (2006.01)
  *H01L 29/66* (2006.01)
  *H01L 29/417* (2006.01)
  *H01L 29/423* (2006.01)
  *H01L 21/265* (2006.01)

(52) U.S. Cl.
  CPC .. *H01L 29/78696* (2013.01); *H01L 21/26506* (2013.01); *H01L 29/41733* (2013.01); *H01L 29/42384* (2013.01); *H01L 29/66757* (2013.01); *H01L 29/7866* (2013.01)

(58) Field of Classification Search
  CPC ........... H01L 27/3262; H01L 21/26506; H01L 29/78696; H01L 29/41733; H01L 29/42384; H01L 29/66757; H01L 29/7866
  USPC .................................. 438/618, 622; 257/72
  See application file for complete search history.

(56) References Cited

U.S. PATENT DOCUMENTS 5,429,962 A 7/1995 Yang
2002/0192938 A1* 12/2002 Wada ................. H01L 21/2855
                                                                       438/618
2006/0091551 A1* 5/2006 Lin .......................... C25D 3/58
                                                                       257/762

(Continued)

FOREIGN PATENT DOCUMENTS

JP         06-291145 A    10/1994
KR  10-2001-0004613 A     1/2001
KR  10-2005-0050881 A     6/2005

*Primary Examiner* — Dale E Page
*Assistant Examiner* — Quovaunda V Jefferson
(74) *Attorney, Agent, or Firm* — Robert E. Bushnell, Esq.

(57) ABSTRACT

A semiconductor device and a method of manufacturing the semiconductor device are provided. The semiconductor device includes a semiconductor layer, a gate electrode on the semiconductor layer, a first insulating layer between the semiconductor layer and the gate electrode; a second insulating layer on the gate electrode, source and drain electrodes corresponding to both ends of the semiconductor layer and disposed on the second insulating layer, and a doping layer disposed along contact holes of the first and second insulating layers, which expose the both ends of the semiconductor layer, such as, between the both ends of the semiconductor layer and the source and drain electrodes.

17 Claims, 6 Drawing Sheets

(56) References Cited

U.S. PATENT DOCUMENTS

2009/0057674 A1* 3/2009 Jeong .................. H01L 29/7869
 257/59
2014/0367776 A1 12/2014 Pang

* cited by examiner

SEMICONDUCTOR DEVICE AND METHOD OF MANUFACTURING THE SAME

CROSS-REFERENCE TO RELATED APPLICATION

This application claims the priority to and all the benefits accruing under 35 U.S.C. §119 of Korean Patent Application No. 10-2015-0138610, filed on Oct. 1, 2015, in the Korean Intellectual Property Office (KIPO), the disclosure of which is incorporated herein in its entirety by reference.

BACKGROUND OF THE INVENTION

1. Field of the Disclosure

One or more exemplary embodiments relate to a semiconductor device and a method of forming the semiconductor device.

2. Description of the Related Art

Semiconductor devices are used in a display apparatus, such as an active matrix liquid crystal display (AMLCD) or an active matrix organic light-emitting display (AMOLED).

SUMMARY

As the resolution of a display apparatus increases, the area of a unit pixel is reduced and thus the sizes of thin film transistors are also reduced. In this case, the channel lengths of the thin film transistors also become short, and thus, a short channel effect may occur in the thin film transistors.

One or more exemplary embodiments include a semiconductor device for suppressing a short channel effect.

Additional aspects will be set forth in part in the description which follows and, in part, will be apparent from the description, or may be learned by practice of the presented embodiments.

According to one or more exemplary embodiments, a semiconductor device includes a semiconductor layer; a gate electrode on the semiconductor layer; a first insulating layer between the semiconductor layer and the gate electrode; a second insulating layer on the gate electrode; source and drain electrodes corresponding to both ends of the semiconductor layer and disposed on the second insulating layer; and a doping layer disposed along contact holes of the first and second insulating layers, which expose the both ends of the semiconductor layer, such as, between the both ends of the semiconductor layer and the source and drain electrodes.

The doping layer may include a first doping layer on the both ends of the semiconductor layer; and a second doping layer between the first doping layer and the source and drain electrodes.

A dopant concentration of the first doping layer may be lower than that of the second doping layer.

The doping layer may contact an upper surface of the second insulating layer, inside walls of the contact holes, and the both ends of the semiconductor layer exposed by the contact holes.

The doping layer may include a first doping layer that contacts upper surfaces of the both ends of the semiconductor layer exposed by the contact holes; and a second doping layer that contacts an upper surface of the first doping layer and contacts a lower surface of the source electrode and a lower surface of the drain electrode.

The doping layer may include a material that is the same as that of the semiconductor layer.

The doping layer may include a material that is different from that of the semiconductor layer.

The doping layer may include a material having a surface resistance that is different from that of the semiconductor layer.

In the doping layer, a dopant concentration of a layer close to the semiconductor layer may be relatively low and a dopant concentration of a layer close to the source and drain electrodes may be relatively high.

According to one or more exemplary embodiments, a method of manufacturing a semiconductor device includes forming a semiconductor layer on a substrate; forming a first insulating layer on the semiconductor layer; forming a gate electrode on the semiconductor layer; forming a second insulating layer on the gate electrode; and forming a doping layer, a source electrode, and a drain electrode in contact holes of the first and second insulating layers, which expose both ends of the semiconductor layer, and on the second insulating layer around the contact holes.

Formation of the doping layer, the source electrode, and the drain electrode may include forming contact holes, which expose both ends of the semiconductor layer, in the first and second insulating layers; forming a dopant-containing layer along the contact holes from an upper surface of the second insulating layer around the contact holes; forming a conductive layer on the dopant-containing layer; and forming the doping layer, the source electrode, and the drain electrode by patterning the dopant-containing layer and the conductive layer.

The forming of the dopant-containing layer may include: forming a first dopant-containing layer along the contact holes from an upper surface of the second insulating layer around the contact holes; and forming a second dopant-containing layer on the first dopant-containing layer.

A dopant concentration of the first dopant-containing layer may be lower than that of the second dopant-containing layer.

The doping layer may include a material that is the same as that of the semiconductor layer.

The doping layer may include a material that is different from that of the semiconductor layer.

The doping layer may include a material having a surface resistance that is different from that of the semiconductor layer.

The doping layer may be a doping concentration gradient layer.

The doping layer may have a multilayer structure having two or more concentration differences.

The present embodiments may provide a semiconductor device having a structure in which a desired level of light doped drain (LDD) may be formed in a small area and a short channel effect may be suppressed.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF THE INVENTION

Figure 1:
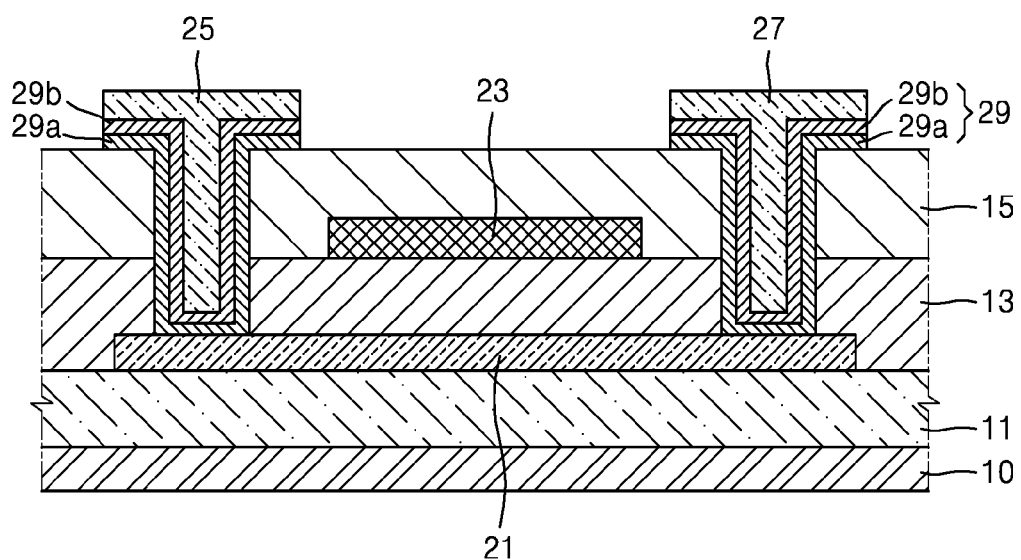
FIG. 1 is a cross-sectional view illustrating a semiconductor device according to an exemplary embodiment of the inventive concept.

As the inventive concept allows for various changes and numerous exemplary embodiments, particular exemplary embodiments will be illustrated in the drawings and described in detail in the written description. The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the exemplary embodiments set forth herein.

The inventive concept will now be described more fully with reference to the accompanying drawings, in which exemplary embodiments of the invention are shown. Like reference numerals in the drawings denote like elements, and thus their description will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following exemplary embodiments are not limited thereto.

FIG. 1 is a cross-sectional view illustrating a semiconductor device according to an exemplary embodiment of the inventive concept.

Referring to FIG. 1, the semiconductor device according to the exemplary embodiment of the inventive concept may be a thin film transistor (TFT) including a semiconductor layer 21, a gate electrode 23, a source electrode 25, a drain electrode 27, and a doping layer 29.

The semiconductor layer 21 is disposed on a buffer layer 11 on a substrate 10. The substrate 10 may be a low-temperature polycrystaline silicon (LTPS) substrate, a glass substrate, or a plastic substrate. The semiconductor layer 21 is an undoped channel region including a semiconductor material.

The gate electrode 23 corresponds to a central portion of the semiconductor layer 21. A first insulating layer 13, which is a gate insulating film for insulation between the semiconductor layer 21 and the gate electrode 23, is interposed between the semiconductor layer 21 and the gate electrode 23.

The source electrode 25 and the drain electrode 27 are disposed on the semiconductor layer 21 and the gate electrode 23. A second insulating layer 15, which is an interlayer insulating film for insulation between the gate electrode 23 and the source electrode 25 and between the gate electrode 23 and the drain electrode 27, is interposed between the gate electrode 23 and the source electrode 25 and between the gate electrode 23 and the drain electrode 27. The doping layer 29, the source electrode 25, and the drain electrode 27 are disposed on the second insulating layer 15 and respectively correspond to portions of both ends of the semiconductor layer 21. Contact holes that expose both ends of the semiconductor layer 21 are formed in the first insulating layer 13 and the second insulating layer 15. In other words, the doping layer 29, the source electrode 25, and the drain electrode 27 are disposed in the contact holes and on the second insulating layer 15 around the contact holes. The doping layer 29 is interposed between the source electrode 25 and the semiconductor layer 21 and between the drain electrode 27 and the semiconductor layer 21.

In the semiconductor device according to the exemplary embodiment of the inventive concept, the doping layer 29, which contacts an upper surface of the semiconductor layer 21, which is undoped and functions as a channel, is additionally disposed. The doping layer 29 may include a single layer or layers having different dopant contents.

In an exemplary embodiment, the doping layer 29 may include a material that is the same as or different from that of the semiconductor layer 21. In an exemplary embodiment, the doping layer 29 may include a material having sheet resistance that is different from that of a material forming the semiconductor layer 21. Due to this, a contact resistance difference may occur between the doping layer 29 and the semiconductor layer 21.

The doping layer 29 may include n-type or p-type dopants. The semiconductor device may be implemented as an NMOS TFT, a PMOS TFT, or a CMOS TFT depending on the type of dopant. Dopant concentration of a first doping layer 29$a$ is lower than that of a second doping layer 29$b$. The doping layer 29 contacts the semiconductor layer 21 via the contact holes formed in the first and second insulating layers 13 and 15, and thus connects the source electrode 25 and the drain electrode 27 to the semiconductor layer 21.

In an exemplary embodiment, the doping layer 29 may include the first doping layer 29$a$ and the second doping layer 29$b$. The first doping layer 29$a$ is disposed on both ends of the semiconductor layer 21, and the second doping layer 29$b$ is disposed between the first doping layer 29$a$ and the source electrode 25 and between the first doping layer 29$a$ and the drain electrode 27. The first doping layer 29$a$ contacts upper surfaces of both ends of the semiconductor layer 21. The second doping layer 29$b$ contacts an upper surface of the first doping layer 29$a$, a lower surface of the source electrode 25, and a lower surface of the drain electrode 27. The first doping layer 29$a$ may function as a light doped drain (LDD). The second doping layer 29$b$ may function as a junction.

FIGS. 2 through 7 are cross-sectional views illustrating a method of manufacturing a semiconductor device, according to an exemplary embodiment of the inventive concept.

Figure 2:
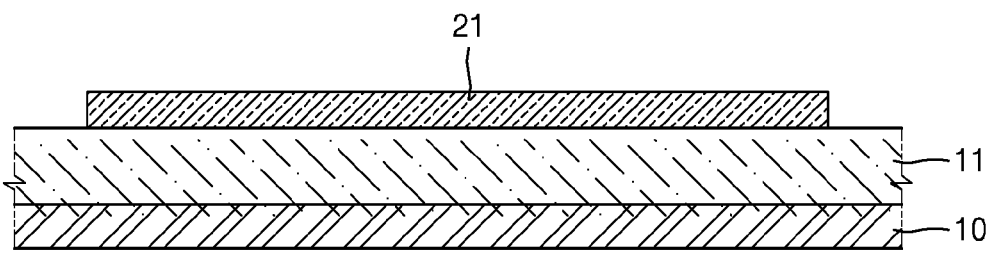
FIGS. 2 through 7 are cross-sectional views illustrating aspects of a sequence of steps for a method of manufacturing a semiconductor device, according to an exemplary embodiment of the inventive concept.

Referring to FIG. 2, a buffer layer 11 is formed on a substrate 10, and a semiconductor layer 21 is formed on the buffer layer 11.

The substrate 10 may include a transparent glass material including $SiO_2$ as a main component. However, the substrate 10 is not limited thereto and may be a substrate including any one of various materials, such as a transparent plastic material or metal material.

A buffer layer 11 may be formed on an upper surface of the substrate 10 to prevent impurity ions from being diffused in the substrate 10, prevent the penetration of moisture or external air, and flatten the upper surface of the substrate 10. The buffer layer 11 may include $SiO_2$ and/or $SiN_x$ and be formed by using any one of various deposition methods. The buffer layer 11 may not be formed.

The semiconductor layer 21 may be formed by depositing amorphous silicon or polysilicon on the whole upper surface of the substrate 10 and then patterning the deposited amorphous silicon or polysilicon through an etching process. The amorphous silicon or the polysilicon may be deposited on the substrate 10 by using a plasma-enhanced chemical vapor deposition (PECVD) method, an atmospheric pressure CVD (APCVD) method, or a low pressure CVD (LPCVD) method. In this case, the polysilicon may be formed by crystallizing the amorphous silicon. The amorphous silicon may be crystallized by using one of various methods, such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

Figure 3:
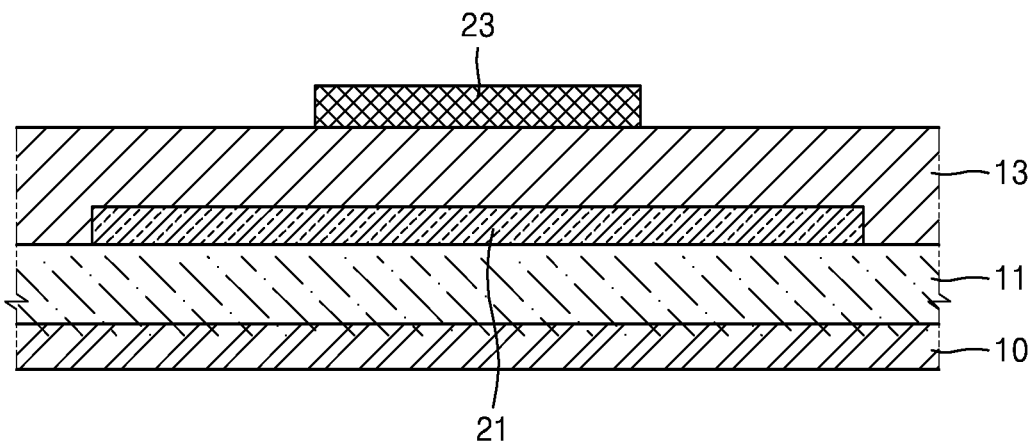

Referring to FIG. 3, a first insulating layer 13 is formed on the semiconductor layer 21, and a gate electrode 23 is formed on the first insulating layer 13.

The first insulating layer 13 may include an inorganic insulating material, such as $SiN_x$ or $SiO_x$, by using a PECVD method, an APCVD method, or an LPCVD method.

The gate electrode 23 may be formed by forming a first conductive layer above the whole upper surface of the substrate 10 and then patterning the first conductive layer through an etching process. The first conductive layer may include a single layer or multiple layers which include one or more selected from aluminum (Al), platinum (Pt), palladium (Pd), silver (Ag), magnesium (Mg), gold (Au), nickel (Ni), neodymium (Nd), iridium (Jr), chromium (Cr), nickel (Li), calcium (Ca), molybdenum (Mo), titanium (Ti), tungsten (W), and copper (Cu).

Figure 4:
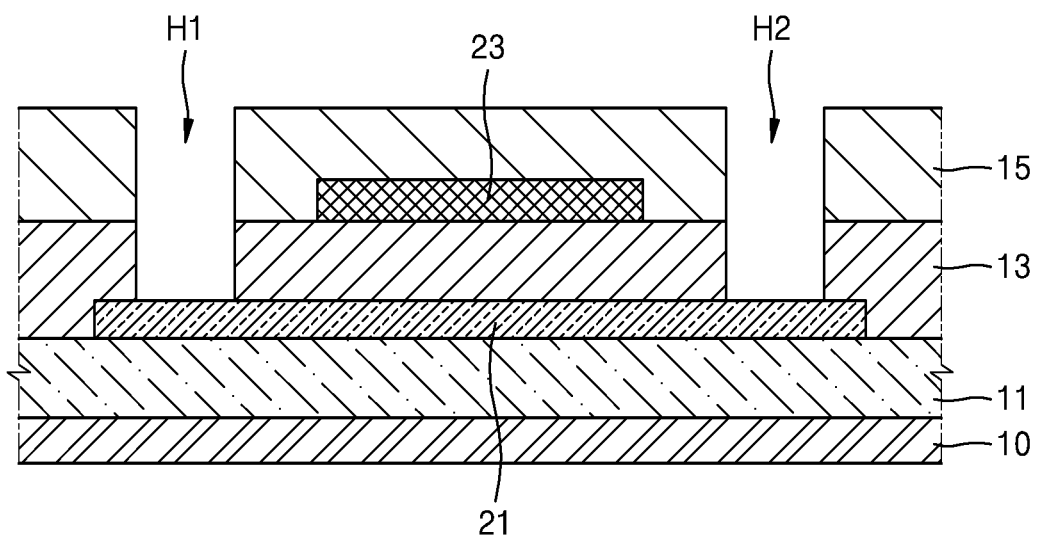

Referring to FIG. 4, a second insulating layer 15 is formed on the gate electrode 23, and contact holes H1 and H2 are formed in the first insulating layer 13 and the second insulating layer 15.

The second insulating layer 15 includes one or more organic insulating materials selected from the group consisting of polyimide, polyamide, acrylic resin, benzocyclobutene, and phenol resin and is formed by using a method such as spin coating. The second insulating layer 15 may include an inorganic insulating material, which is the same as that of the first insulating layer 13, as well as an organic insulating material as described above, and may be formed by alternately stacking the organic insulating material and the inorganic insulating material.

The contact holes H1 and H2 are formed in the first insulating layer 13 and the second insulating layer 15 and expose both ends of the semiconductor layer 21.

Figure 5:
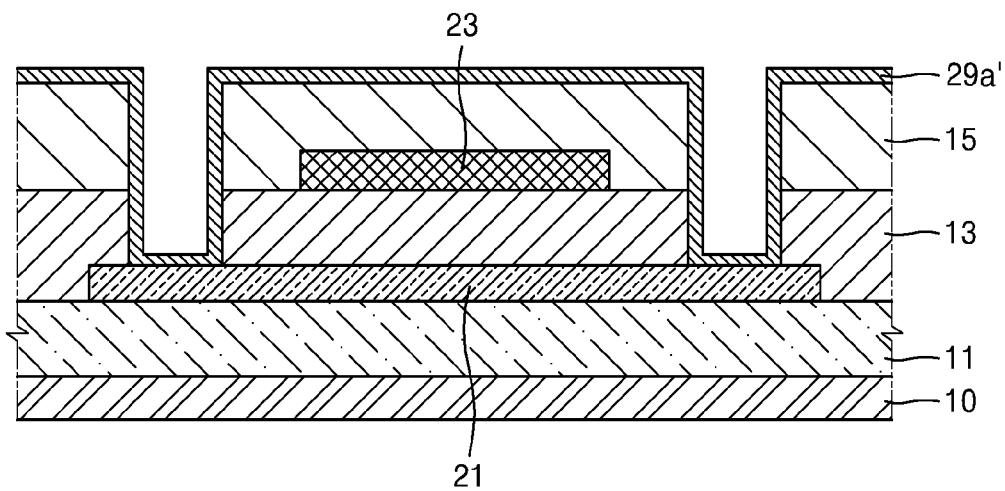

Referring to FIG. 5, a first material layer 29a' including dopants at a first concentration is formed on the second insulating layer 15 and formed above the whole upper surface of the substrate 10.

The first material layer 29a' may include amorphous silicon or polysilicon including n-type or p-type dopants at a low concentration. The first material layer 29a' may be formed by depositing amorphous silicon or polysilicon on the substrate 10 through a PECVD method, an APCVD method, or an LPCVD method. In this case, the polysilicon may be formed by crystallizing the amorphous silicon. The amorphous silicon may be crystallized by using one of various methods, such as an RTA method, an SPC method, an ELA method, an MIC method, an MILC method, and an SLS method.

For example, the first material layer 29a' may be formed above the substrate 10 by using a CVD deposition method using a silicon (Si)-based gas including n-type or p-type dopants at a low concentration so that the first material layer 29a' has sufficient resistance to be used as an LDD.

However, the exemplary embodiment of the inventive concept is not limited thereto. For example, the first material layer 29a' may include a semiconductor material of the same kind as or a different kind from the semiconductor layer 21 or may include a material having a surface resistance that is different from that of the semiconductor layer 21.

The first material layer 29a' covers an upper surface of the second insulating layer 15, side surfaces of the contact holes H1 and H2, and upper surfaces of the exposed both ends of the semiconductor layer 21.

Figure 6:
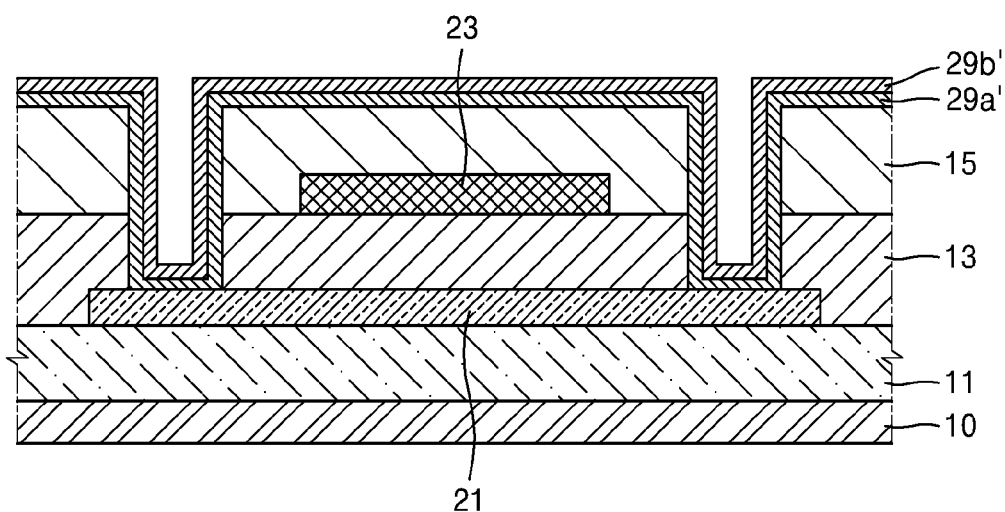

Referring to FIG. 6, a second material layer 29b' including dopants at a second concentration is formed on the second insulating layer 15 and formed above the whole upper surface of the substrate 10.

The second material layer 29b' may include amorphous silicon or polysilicon including n-type or p-type dopants at a high concentration. The second material layer 29b' may be formed by depositing amorphous silicon or polysilicon on the substrate 10 through a PECVD method, an APCVD method, or an LPCVD method. In this case, the polysilicon may be formed by crystallizing the amorphous silicon. The amorphous silicon may be crystallized by using one of various methods, such as an RTA method, an SPC method, an ELA method, an MIC method, an MILC method, and an SLS method.

For example, the second material layer 29b' may be formed above the substrate 10 by using a CVD deposition method using a silicon (Si)-based gas including n-type or p-type dopants at a high concentration so that the second material layer 29b' has sufficient resistance to be used as a junction.

However, the exemplary embodiment of the inventive concept is not limited thereto. For example, the second material layer 29b' may include a semiconductor material of the same kind as or a different kind from the semiconductor layer 21 or may include a material having a surface resistance that is different from that of the semiconductor layer 21.

The second concentration of the second material layer 29b' is higher than the first concentration of the first material layer 29a'.

The second material layer 29b' covers the upper surface of the second insulating layer 15, the side surfaces of the contact holes H1 and H2, and the upper surfaces of the exposed both ends of the semiconductor layer 21.

Dopant concentration (the content of dopant) may be changed by adjusting a gas that is used in a CVD deposition method. The first material layer 29a' deposited through a CVD deposition method may have a first dose of dopants, for example, boron or phosphorus at about 1e9 to 1e13 ions/cm$^2$, and the second material layer 29b' deposited through a CVD deposition method may have a second dose of dopants, which is higher than the first dose of dopants, for example, boron or phosphorus at about 1e14 to 1e20 ions/cm$^2$.

When the first material layer 29a' and the second material layer 29b' include amorphous silicon, the first material layer 29a' and the second material layer 29b' may be crystallized separately or be crystallized simultaneously.

Figure 7:
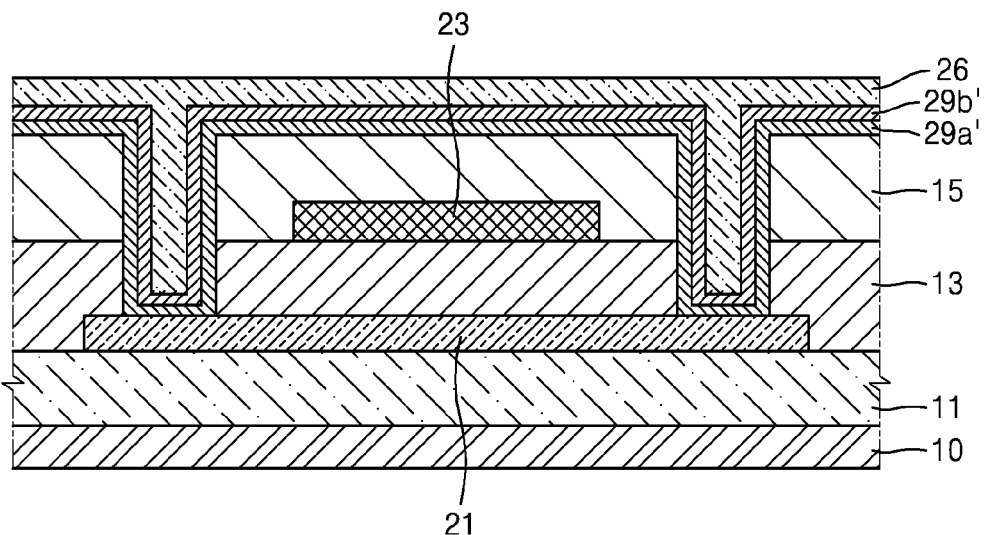

Referring to FIG. 7, a second conductive layer 26 is formed on the second material layer 29b' to form a source electrode 25 and a drain electrode 27. The second conductive layer 26 is formed above the whole upper surface of the substrate 10.

The second conductive layer 26 may include a single layer or multiple layers which include one or more selected from Al, Pt, Pd, Ag, Mg, Au, Ni, Nd, Ir, Cr, Li, Ca, Mo, Ti, W, and Cu.

Figure 8:
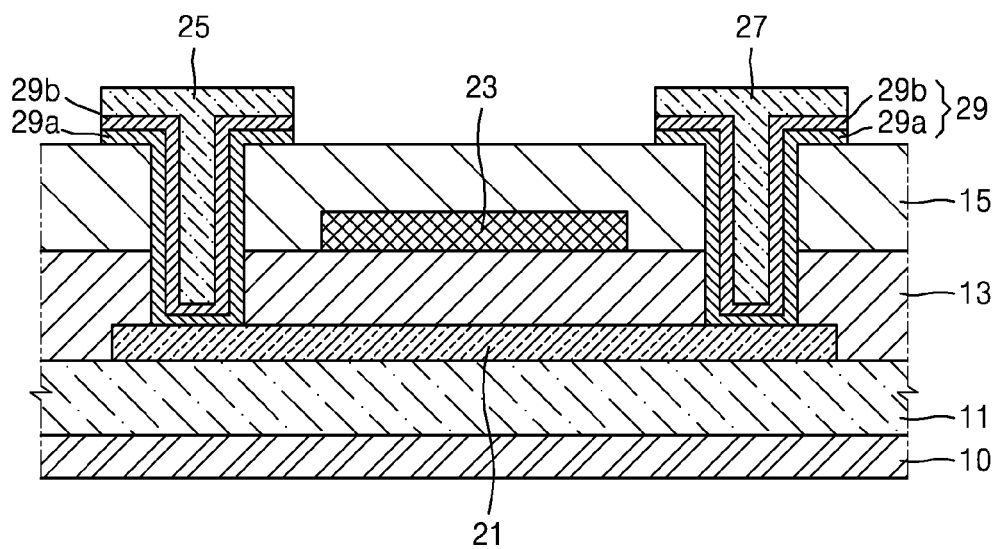
FIG. 8 is a cross-sectional view illustrating the semiconductor device after processing steps shown in FIGS. 2 through 7.

Thereafter, a doping layer 29 including a first doping layer 29a and a second doping layer 29b, as illustrated in FIG. 8, is formed by patterning the first material layer 29a' and the second material layer 29b', and the source and drain electrodes 25 and 27, as illustrated in FIG. 1, are formed by patterning the second conductive layer 26.

To this end, a photoresist pattern may be formed on the first material layer 29a', the second material layer 29b', and the second conductive layer 26 by using a mask, and the second conductive layer 26, the second material layer 29b', and the first material layer 29a' may be sequentially or simultaneously etched.

As a result, the doping layer 29 including the first doping layer 29a and the second doping layer 29b contacts the semiconductor layer 21 via the contact holes H1 and H2, and the source and drain electrodes 25 and 27 are connected to the semiconductor layer 21.

In the semiconductor device (FIG. 8) after processing steps shown in FIGS. 2 through 7, according to the exemplary embodiment of the inventive concept, it is not necessary to secure an additional space for forming an LDD structure or a long channel.

Figure 9:
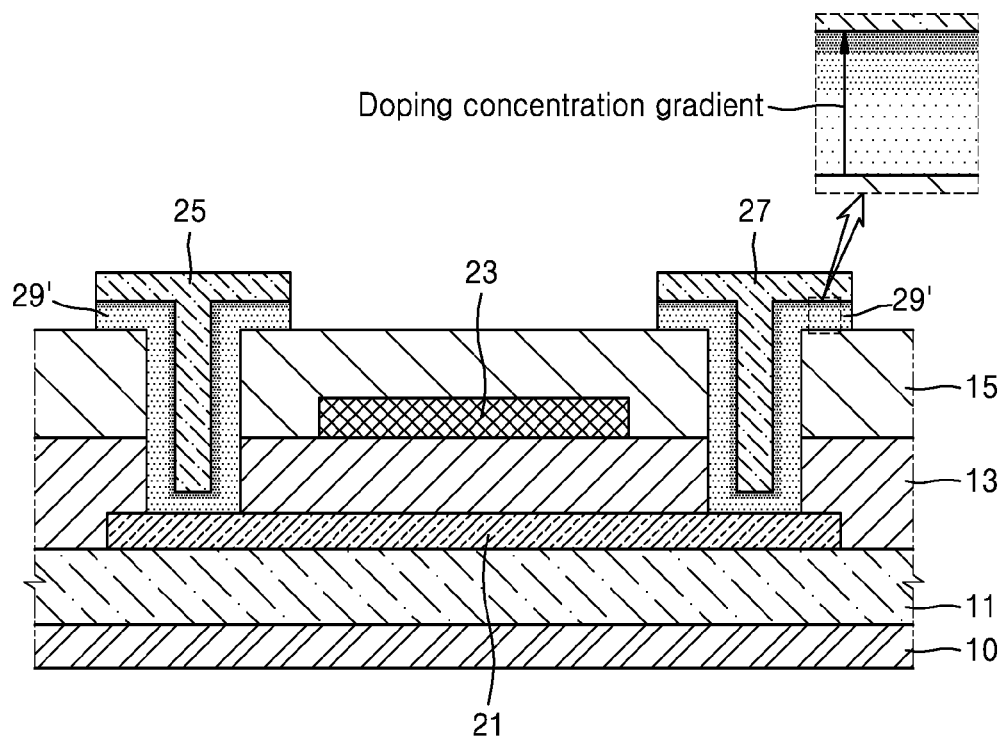
FIG. 9 is a cross-sectional view illustrating a semiconductor device according to another exemplary embodiment of the inventive concept.

FIG. 9 is a cross-sectional view illustrating a semiconductor device according to another exemplary embodiment of the inventive concept.

Figure 10:
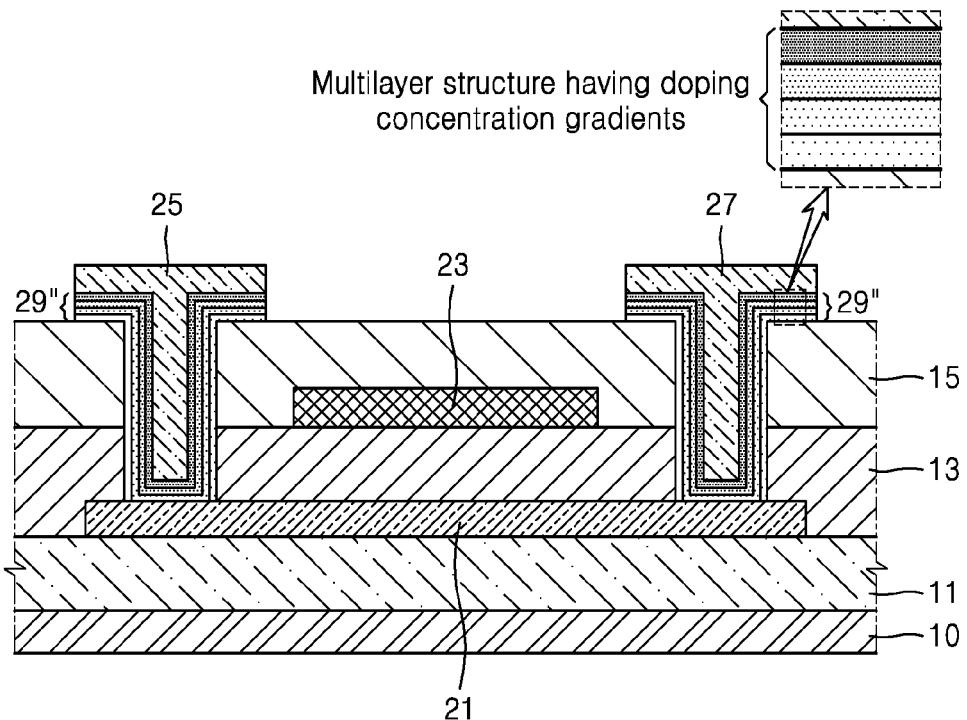
FIG. 10 is a cross-sectional view illustrating a semiconductor device according to yet another exemplary embodiment of the inventive concept.

Referring to FIG. 9, a doping layer 29' of the semiconductor device may be formed to have a dopant concentration gradient. In this case, the dopant concentration of a layer close to the semiconductor layer 21 is relatively low, and the dopant concentration of a layer close to source and drain electrodes 25 and 27 is relatively high. The doping layer 29' may include a multilayer structure (29") in FIG. 10 having two or more concentration differences. The doping layer 29' may be formed a single layer. The doping layer 29' may be formed from two or more layers merged into one layer by thermal method such as sintering or heating. A direction of the dopant concentration gradient of the doping layer 29' may be from top to bottom direction. The doping layer 29' may have a continuous concentration gradient or a stepwise concentration gradient.

For example, by adjusting a dopant concentration when forming the doping layer 29' by using a Si-based gas including dopants through a CVD method, the doping layer 29', which has a double layer structure including a lower layer functioning as an LDD and an upper layer functioning as a junction, may be formed on the substrate 10 by a single process.

Other elements are the same as those described above with reference to FIG. 1, and thus, descriptions thereof are omitted.

Figure 11:
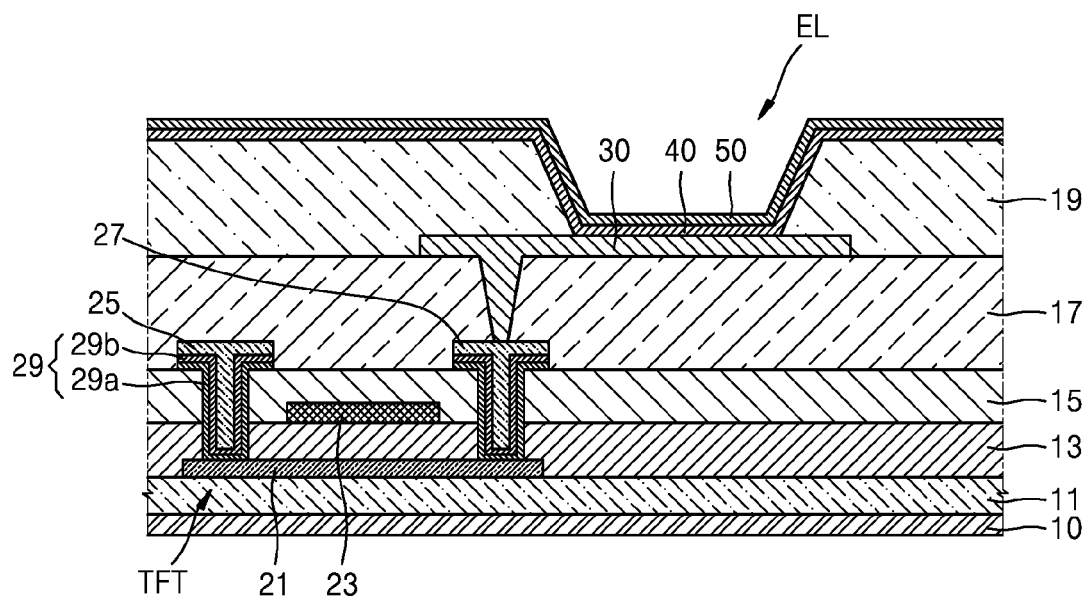
FIG. 11 is a cross-sectional view illustrating a part of an organic light-emitting display apparatus including a semiconductor device according to an exemplary embodiment of the inventive concept.

FIG. 11 is a cross-sectional view illustrating a part of an organic light-emitting display apparatus including a semiconductor device according to an exemplary embodiment of the inventive concept. Hereinafter, detailed descriptions of the semiconductor device described with reference to FIGS. 2 to 7 are omitted.

Referring to FIG. 11, the organic light-emitting display apparatus includes a thin-film transistor TFT, which is the semiconductor device illustrated in FIGS. 1 and 8, and a light-emitting device EL electrically connected to the thin-film transistor TFT. A third insulating layer 17 may be disposed on the thin-film transistor TFT, and the light-emitting device EL may be disposed on the third insulating layer 17.

The third insulating layer 17 is formed to cover the thin-film transistor TFT. The third insulating layer 17 may include one or more organic insulating materials or inorganic insulating materials, similar to the second insulating layer 15, and may be formed by alternately stacking an organic insulating material and an inorganic insulating material.

The light-emitting device EL may include a first electrode 30, a second electrode 50, and an intermediate layer 40 between the first electrode 30 and the second electrode 50.

The first electrode 30 is connected to one of the source and drain electrodes 25 and 27 of the thin-film transistor TFT. As an example, in the exemplary embodiment of FIG. 9, the first electrode 30 is connected to the drain electrode 27 of the thin-film transistor TFT. The first electrode 30 may be a reflective electrode, and may include a reflective layer including at least one material selected from Ag, Mg, Al, Pt, Pd, Au, Ni, Nd, Jr, Cr, and a combination thereof and a transparent or semi-transparent electrode formed on the reflective layer. In another exemplary embodiment, the first electrode 30 may be a transparent electrode, and may include a transparent conductive material, such as ITO, IZO, ZnO, or In$_2$O$_3$.

The first electrode 30 may be formed in each pixel to have an isolated island shape.

The second electrode 50 may be a transparent or semi-transparent electrode, may include at least one material selected from Ag, Al, Mg, Li, Ca, Cu, LiF/Ca, LiF/Al, MgAg, and CaAg, and may include a thin film having a thickness that ranges from several to tens of nm. The second electrode 50 may be provided to be electrically connected to all pixels included in the display apparatus. In another exemplary embodiment, the second electrode 50 may be a reflective electrode, and may be formed by depositing a reflective conductive material, such as Li, Ca, LiF/Ca, LiF/Al, Al, Ag, Mg, Ba, or a combination thereof.

An intermediate layer 40 may be disposed between the first electrode 30 and the second electrode 50. The intermediate layer 40 may include an organic emission layer, and may further include at least one selected from a hole injection layer (HIL), a hole transport layer (HTL), an electron transport layer (ETL), and an electron injection layer (EIL). However, the present embodiment is not limited thereto, and various functional layers may be further disposed between the first electrode 30 and the second electrode 50.

The organic emission layer may emit red light, green light, or blue light. However, the inventive concept is not limited thereto, and the organic emission layer may emit white light. In this case, the organic emission layer may include a structure in which a light-emitting material that emits red light, a light-emitting material that emits green light, and a light-emitting material that emits blue light are stacked, or a structure in which a light-emitting material that emits red light, a light-emitting material that emits green light, and a light-emitting material that emits blue light are combined with one another. The red, green, and blue light are exemplary, and the inventive concept is not limited thereto. That is, as long as white light may be emitted, any other combinations than the combination of red, green, and blue light may be made.

A fourth insulating layer 19 covers an edge of the first electrode 30 and functions as a pixel-defining layer. The fourth insulating layer 19 may include one or more organic insulating materials or inorganic insulating materials, similar to the second insulating layer 15, and may be formed by alternately stacking an organic insulating material and an inorganic insulating material.

Although an organic light-emitting display apparatus is described as an example in the exemplary embodiment of FIG. 11, the inventive concept is not limited thereto and may be applied to various display apparatuses, such as a liquid crystal display apparatus.

As the resolution of a conventional display apparatus increases, the area of a unit pixel is reduced and thus the sizes of thin film transistors are also reduced. In this case, the channel lengths of the thin film transistors also become short, and thus, a short channel effect may occur in the thin film transistors.

The thin-film transistor manufactured according to the exemplary embodiment has a structure in which an LDD structure may be formed without concomitantly requiring that an additional area and the length of a channel may also be increased, and thus may suppress a short channel effect of the thin-film transistor.

The semiconductor device according to the exemplary embodiments does not need an additional space for forming an LDD, and thus a semiconductor device having an LDD structure may be formed also in a high resolution device. Accordingly, device characteristics and reliability of the semiconductor device may be improved. In addition, in the case of the same resolution, it is possible to reduce the size of the semiconductor device having an LDD structure according to the exemplary embodiment.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A semiconductor device comprising:
    a semiconductor layer;
    a gate electrode on the semiconductor layer;
    a first insulating layer between the semiconductor layer and the gate electrode;
    a second insulating layer on the gate electrode;
    source and drain electrodes corresponding to both ends of the semiconductor layer and disposed on the second insulating layer; and
    a doping layer disposed along a contact hole of the first and second insulating layers, the contact hole exposing the both ends of the semiconductor layer, wherein the doping layer having a multilayer structure, and wherein, in the doping layer, a dopant concentration of a layer close to the semiconductor layer is relatively low and a dopant concentration of a layer close to the source and drain electrodes is relatively high.

2. The semiconductor device of claim 1, wherein the doping layer comprises:
    a first doping layer on the both ends of the semiconductor layer; and
    a second doping layer between the first doping layer and the source and drain electrodes.

3. The semiconductor device of claim 2, wherein a dopant concentration of the first doping layer is lower than that of the second doping layer.

4. The semiconductor device of claim 1, wherein the doping layer contacts an upper surface of the second insulating layer, inside walls of the contact holes, and the both ends of the semiconductor layer exposed by the contact holes.

5. The semiconductor device of claim 1, wherein the doping layer comprises:
    a first doping layer that contacts upper surfaces of the both ends of the semiconductor layer exposed by the contact holes; and
    a second doping layer that contacts an upper surface of the first doping layer and contacts a lower surface of the source electrode and a lower surface of the drain electrode.

6. The semiconductor device of claim 1, wherein the doping layer comprises a material that is the same as that of the semiconductor layer.

7. The semiconductor device of claim 1, wherein the doping layer comprises a material that is different from that of the semiconductor layer.

8. The semiconductor device of claim 1, wherein the doping layer comprises a material having a surface resistance that is different from that of the semiconductor layer.

9. A method of manufacturing a semiconductor device, the method comprising:
    forming a semiconductor layer on a substrate;
    forming a first insulating layer on the semiconductor layer;
    forming a gate electrode on the semiconductor layer;
    forming a second insulating layer on the gate electrode; and
    forming a doping layer, a source electrode, and a drain electrode in contact holes of the first and second insulating layers, which expose both ends of the semiconductor layer, and on the second insulating layer around the contact holes, wherein the doping layer having a multilayer structure, and wherein, in the doping layer, a dopant concentration of a layer close to the semiconductor layer is relatively low and a dopant concentration of a layer close to the source and drain electrodes is relatively high.

10. The method of claim 9, wherein the forming of the doping layer, the source electrode, and the drain electrode comprises:
    forming contact holes, which expose both ends of the semiconductor layer, in the first and second insulating layers;

forming a dopant-containing layer along the contact holes from an upper surface of the second insulating layer around the contact holes;

forming a conductive layer on the dopant-containing layer; and forming the doping layer, the source electrode, and the drain electrode by patterning the dopant-containing layer and the conductive layer.

11. The method of claim 10, wherein the forming of the dopant-containing layer comprises:

forming a first dopant-containing layer along the contact holes from an upper surface of the second insulating layer around the contact holes; and forming a second dopant-containing layer on the first dopant-containing layer.

12. The method of claim 11, wherein a dopant concentration of the first dopant-containing layer is lower than that of the second dopant-containing layer.

13. The method of claim 9, wherein the doping layer comprises a material that is the same as that of the semiconductor layer.

14. The method of claim 9, wherein the doping layer comprises a material that is different from that of the semiconductor layer.

15. The method of claim 9, wherein the doping layer comprises a material having a surface resistance that is different from that of the semiconductor layer.

16. The semiconductor device of claim 1, wherein the doping layer is a doping concentration gradient layer.

17. The method of claim 9, wherein the doping layer is a doping concentration gradient layer.

* * * * *